United States Patent
Khan et al.

(10) Patent No.: US 8,796,097 B2
(45) Date of Patent: Aug. 5, 2014

(54) SELECTIVELY AREA REGROWN III-NITRIDE HIGH ELECTRON MOBILITY TRANSISTOR

(71) Applicants: Asif Khan, Irmo, SC (US); Qhalid Fareed, Columbia, SC (US); Vinod Adivarahan, Columbia, SC (US)

(72) Inventors: Asif Khan, Irmo, SC (US); Qhalid Fareed, Columbia, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 13/870,558

(22) Filed: Apr. 25, 2013

(65) Prior Publication Data
US 2013/0313613 A1 Nov. 28, 2013

Related U.S. Application Data

(60) Provisional application No. 61/638,729, filed on Apr. 26, 2012.

(51) Int. Cl.
*H01L 21/336* (2006.01)
*H01L 29/778* (2006.01)
*H01L 29/78* (2006.01)
*H01L 29/66* (2006.01)

(52) U.S. Cl.
CPC .......... *H01L 29/778* (2013.01); *H01L 29/7848* (2013.01); *H01L 29/66431* (2013.01); *H01L 29/6659* (2013.01)
USPC .............. 438/285; 438/46; 438/172; 438/197; 438/478; 438/508; 257/183; 257/192; 257/194; 257/368; 257/410; 257/E21.409; 257/E29.255; 257/E29.266; 257/E29.267

(58) Field of Classification Search
CPC .............. H01L 29/778; H01L 29/7848; H01L 29/6659; H01L 29/66431
USPC ............ 438/46, 172, 197, 478, 508; 257/183, 257/192, 194, 368, 410, E21.409, E29.255, 257/E29.266, E29.267
See application file for complete search history.

(56) References Cited

U.S. PATENT DOCUMENTS

| 4,470,192 A | 9/1984 | Miller |
| 5,192,987 A | 3/1993 | Khan et al. |
| 5,705,443 A | 1/1998 | Stauf et al. |

(Continued)

OTHER PUBLICATIONS

International Search Report for corresponding PCT Application No. PCT/US07/84520, 2 pgs.

(Continued)

*Primary Examiner* — Dao H Nguyen
(74) *Attorney, Agent, or Firm* — Dority & Manning, P.A.

(57) ABSTRACT

Methods for forming a HEMT device are provided. The method includes forming an ultra-thin barrier layer on the plurality of thin film layers. A dielectric thin film layer is formed over a portion of the ultra-thin barrier layer to leave exposed areas of the ultra-thin barrier layer. A SAG S-D thin film layer is formed over the exposed areas of the ultra-thin barrier layer while leaving the dielectric thin film layer exposed. The dielectric thin film layer is then removed to expose the underlying ultra-thin barrier layer. The underlying ultra-thin barrier layer is treating with fluorine to form a treated area. A source and drain is added on the SAG S-D thin film layer, and a dielectric coating is deposited over the ultra-thin barrier layer treated with fluorine such that the dielectric coating is positioned between the source and the drain.

21 Claims, 4 Drawing Sheets

(56) References Cited

U.S. PATENT DOCUMENTS

| | | | |
|---|---|---|---|
| 5,779,926 | A | 7/1998 | Ma et al. |
| 6,233,267 | B1 | 5/2001 | Nurmikko et al. |
| 6,277,219 | B1 | 8/2001 | Heinz et al. |
| 6,429,467 | B1 | 8/2002 | Ando |
| 6,441,393 | B2 | 8/2002 | Goetz et al. |
| 6,573,129 | B2 | 6/2003 | Hoke et al. |
| 6,620,662 | B2 | 9/2003 | Hoke et al. |
| 6,690,042 | B2 | 2/2004 | Khan et al. |
| 6,764,888 | B2 | 7/2004 | Khan et al. |
| 6,797,994 | B1 | 9/2004 | Hoke et al. |
| 6,825,134 | B2 | 11/2004 | Law et al. |
| 8,318,562 | B2 * | 11/2012 | Khan et al. ............... 438/285 |
| 8,338,273 | B2 | 12/2012 | Khan et al. |
| 8,372,697 | B2 | 2/2013 | Khan et al. |
| 8,519,438 | B2 * | 8/2013 | Mishra et al. ............. 257/192 |
| 2002/0031851 | A1 | 3/2002 | Linthicum et al. |
| 2002/0078881 | A1 | 6/2002 | Cuomo et al. |
| 2002/0155670 | A1 | 10/2002 | Malik |
| 2003/0020104 | A1 | 1/2003 | Talin et al. |
| 2003/0188682 | A1 | 10/2003 | Tois et al. |
| 2004/0119067 | A1 | 6/2004 | Weeks, Jr. et al. |
| 2004/0142557 | A1 | 7/2004 | Levy et al. |
| 2004/0224484 | A1 | 11/2004 | Fareed et al. |
| 2005/0168127 | A1 | 8/2005 | Shei et al. |
| 2005/0183658 | A1 | 8/2005 | Nakahata et al. |
| 2007/0015344 | A1 | 1/2007 | Mears et al. |
| 2007/0063186 | A1 | 3/2007 | Rao |
| 2007/0072354 | A1 * | 3/2007 | Lee et al. ................ 438/197 |
| 2007/0228416 | A1 * | 10/2007 | Chen et al. ............... 257/192 |
| 2010/0140745 | A1 | 6/2010 | Khan et al. |
| 2013/0240896 | A1 * | 9/2013 | Ozaki ....................... 257/76 |
| 2013/0256685 | A1 * | 10/2013 | Ohki ......................... 257/76 |

OTHER PUBLICATIONS

International Search Report for corresponding PCT Application No. PCT/US07/87755, 2 pgs.

Adivarahan et al., "Stable CW Operation of Field-Plated GaN-AlGaN MOSHFETs at 19 W/mm". IEEE Elec. Dev. Lett., vol. 26, Issue 8, 535-537, 2005.

Fareed et al., "Vertically Faceted Lateral Overgrowth of GaN on SiC with Conducting Buffer Layers Using Pulsed Metalorganic Chemical Vapor Deposition". Appl. Phys. Lett. 77, No. 15, 2343-2345, Oct. 9, 2000.

Irokawa et al., "Activation characteristics of ion-implanted $Si^+$ in AlGaN". Appl. Phys. Lett. 86, 192102, 2005.

Qiao et al., "Low resistance ohmic contacts on AlGaN/GaN structures using implantation and the "advancing" Al/Ti metallization". Appl. Phys. Lett. vol. 74, No. 18, May 1999.

Simin et al., "AlGaN/InGaN/GaN Double Heterostructure Field-Effect Transistor". Jpn. J. Appl. Phys., vol. 40 No. 11A, L1142-L1144, 2001.

Simin et al., "SiO2/AlGaN/InGaN/GaN Metal-Oxide-Semiconductor Double Heterostructure Field—Effect Transistors". IEEE Elec. Dev. Lett., vol. 23 No. 8, 458-460, 2002.

Walker et al., "High-Power GaAs Fet Amplifiers". Artech House Publishers, Feb. 1993.

Winslow et al., "Principles of Large Signal MESFET Operation", IEEE Trans. Microwave. Theory Tech., vol. 42, 935-942, 1994.

Wu et al., "30-W/mm GaN HEMTs by Field Plate Optimization", IEEE Elec. Dev. Lett., V. 25, 117-119, 2004.

Zhang et al., "Pulsed Atomic Layer Epitaxy of Quaternary AlInGaN Layers", Applied Physics Letters, vol. 79, No. 7, Aug. 13, 2001.

Zhang at al., "Pulsed Atomic-Layer Epitaxy of Ultrahigh-Quality $Al_xGa1-xN$ Structures for Deep Ultraviolet Emissions Below 230 nm", Applied Physics Letters, vol. 81, No. 23, Dec. 2, 2002, pp. 4392-4394.

* cited by examiner

SELECTIVELY AREA REGROWN III-NITRIDE HIGH ELECTRON MOBILITY TRANSISTOR

PRIORITY INFORMATION

The present application claims priority to U.S. Provisional Patent Application Ser. No. 61/638,729 titled "Selectively Area Regrown III-Nitride High Electron Mobility Transistor" of Khan, et al. filed on Apr. 26, 2012, the disclosure of which is incorporated by reference herein.

BACKGROUND OF THE INVENTION

Researchers at the University of South Carolina have pioneered the development of AlInGaN based insulating gate Heterojunction field effect transistors (HFETs), including AlGaN (barrier)/GaN (channel), AlGaN (barrier)/InGaN (channel), and AlInGaN (lattice matched barrier)/GaN (channel) devices. For example, the first report of AlGaN—GaN and AlGaN—GaN—InGaN (back barrier) double heterojunction-field-effect-transistors (DHFETs) was achieved. Additionally, depletion mode and Enhancement mode HFETs have been fabricated using AlGaN—GaN HFETs using the conventional fluorine based gate recessing process.

However, such high-power fluorine etching is the root cause of material damage, increase leakage currents and premature breakdown of the AlInN—GaN HFETs Thus, a need exists for methods of manufacturing group III nitride HFETs without the need for such high-power fluorine etching.

SUMMARY

Objects and advantages of the invention will be set forth in part in the following description, or may be obvious from the description, or may be learned through practice of the invention.

Methods are generally provided for forming a HEMT device on a plurality of thin film layers on a substrate, along with the resulting devices. In one embodiment, the method includes forming an ultra-thin barrier layer on the plurality of thin film layers (e.g., where the ultra-thin barrier layer has a barrier thickness of about 0.2 nm to about 20 nm). A dielectric thin film layer can then be formed over a portion of the ultra-thin barrier layer to leave exposed areas of the ultra-thin barrier layer (e.g., where the dielectric thin film layer has a thickness of about 1 nm to about 100 nm). A SAG S-D thin film layer is formed over the exposed areas of the ultra-thin barrier layer while leaving the dielectric thin film layer exposed (e.g., the SAG S-D thin film layer has a thickness of about 3 nm to about 15 nm). The dielectric thin film layer can then be removed to expose the underlying ultra-thin barrier layer. The underlying ultra-thin barrier layer exposed by removal of the dielectric thin film layer can then be treating with fluorine to form a treated area. A source and drain can be added on the SAG S-D thin film layer, and a dielectric coating can be deposited over the ultra-thin barrier layer treated with fluorine such that the dielectric coating is positioned between the source and the drain. Finally, a gate electrode can be positioned on the dielectric coating.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which:

FIG. 1 shows a dielectric thin film layer formed over a portion of an ultra-thin barrier layer to leave exposed areas of the ultra-thin barrier layer thereon;

FIG. 2 shows an AlInN thin film layer formed over the exposed areas of the ultra-thin barrier layer while leaving the dielectric thin film layer exposed;

FIG. 3 shows the dielectric thin film layer has been removed to expose the underlying ultra-thin barrier layer, which has been treated with fluorine;

FIG. 4 shows a source and drain on the AlInN thin film layer, and a dielectric coating deposited over the ultra-thin barrier layer treated with fluorine such that the dielectric coating is positioned between the source and the drain;

FIG. 5 shows a gate electrode positioned on the dielectric coating; and

FIG. 6 shows a silicon based passivation layer formed around the gate electrode and a field plate electrode positioned on the silicon based passivation layer.

Figure 1:
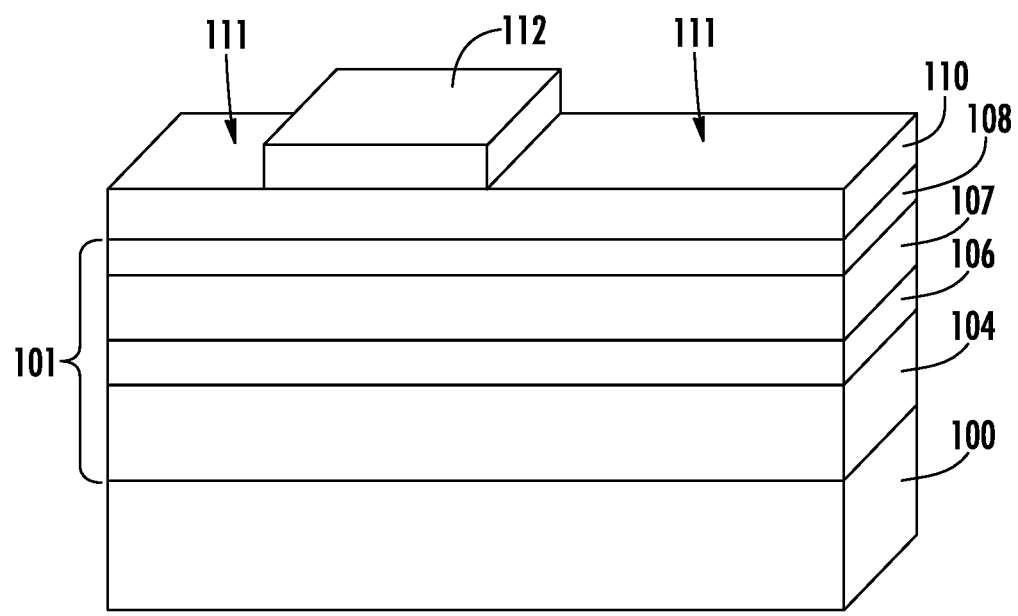
FIGS. 1-6 sequentially show a method of forming a high electron mobility transistors (HEMT) device on a plurality of thin film layers on a substrate, where.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

Additionally, although the invention is not limited to any particular film thickness, the term "thin" describing any film layers of the semiconductor device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

In general, the present disclosure is directed to the fabrication methods of a AlInGaN/InGaN/GaN MOS-Depletion mode HFET, and the HFET device resulting from the fabrication methods. The method of forming the HFET device generally can avoid any recess etching step, and can utilize pulsed deposition of an ultra-thin, high-quality silicon dioxide layer as the active gate-insulator.

The methods of the present invention can be utilized to form any suitable field effect transistor (FET), and are particularly suited for forming high electron mobility transistors (HEMT). A HEMT is a field effect transistor with a junction between two materials with different band gaps (i.e. a heterojunction) as the channel instead of an n-doped region, thus HEMT structures are sometimes referred to as heterostructure field effect transistors (HFET).

The HEMT is a transistor which has a heterojunction formed between two semiconductor materials of different bandgaps. Current in such a device is confined to a very narrow channel at the junction, such current being known as a 2DEG (two dimensional electron gas). In one of the first developments of III-Nitride HEMT, U.S. Pat. No. 5,192,987 of Khan et al. discloses GaN/AlGaN based HEMTs grown on a buffer and a substrate, and is incorporated by reference herein. The general structure of these FET and HFET devices are known in the art. As such, the following description is directed to one embodiment of a HFET device; however, one of ordinary skill in the art would be able to use the following methods to form any suitable FET device.

In one embodiment, a method is generally disclosed of forming a HEMT device on a plurality of thin film layers on a substrate. For example, FIGS. 1-6 show a multilayer stack 101 that forms the plurality of thin film layers on the substrate 100 (e.g., a sapphire substrate, a silicon carbide, gallium nitride, aluminum nitride, aluminum gallium nitride or aluminum indium gallium nitride substrate, or any other suitable semiconductor substrate). In the embodiment shown, the multilayer stack 101 includes a group III nitride epilayer 104 on the substrate 100, a back barrier layer 106 on the group III nitride epilayer 104, and a spacer layer 108 on the back barrier layer 106. Also, in the embodiment shown, a second group III nitride epilayer 107 is positioned between the back barrier layer 106 and the spacer layer 108. In one particular embodiment, a buffer layer (not shown) can be positioned between the group III nitride epilayer 104 and the substrate 100.

In one embodiment, the group III nitride epilayer 104 can include $Al_xIn_yGa_{1-x-y}N$, where $0 \leq x \leq 1$, $0 \leq y \leq 1$ and $0 < x+y \leq 1$. For example, the group III nitride epilayer 104 can include a short period super lattice that is grown via pulsed atomic layer epitaxy to form adjacent layers having a chemical structure of $Al_xIn_yGa_{1-x-y}N$ and $Al_rIn_sGa_{(1-r-s)}N$, respectfully, where $0 \leq x \leq 1$, $0 \leq y \leq 1$, $0 < x+y \leq 1$, $0 \leq r \leq 1$, $0 \leq s \leq 1$, $0 < r+s \leq 1$, with x and r being different and y and s being different. In one particular embodiment, the group III nitride epilayer 104 can include gallium nitride. The group III nitride epilayer 104 can be constructed from any combination of group III elements and nitrogen, as explained above. This layer can be formed, in one particular embodiment, through via PALE in order to selectively control the composition and thickness of the group III nitride epilayer 104.

Likewise, the back barrier layer 106 can, in one embodiment, include $Al_xIn_yGa_{1-x-y}N$, where $0 \leq x \leq 1$, $0 \leq y \leq 1$ and $0 < x+y \leq 1$. For example, the back barrier layer 106 can include AlInGaN.

Similarly, the spacer layer 108 can, in one embodiment, include $Al_xIn_yGa_{1-x-y}N$, where $0 \leq x \leq 1$, $0 \leq y \leq 1$ and $0 < x+y \leq 1$. For example, the spacer layer 108 can include aluminum nitride. The spacer layer 108 can, in one embodiment, be deposited by pulsed atomic layer epitaxy.

According to the method, an ultra-thin barrier layer 110 can be formed on the multilayer stack 101 (i.e., on the plurality of thin film layers), as shown in FIG. 1. For example, the ultra-thin barrier layer 110 can be formed to a have a barrier thickness of about 0.5 nm to about 2.5 nm (e.g., about 1 nm to about 2 nm). In one embodiment, the ultra-thin barrier layer 110 can include $Al_xIn_yGa_{1-x-y}N$ where $0 < x \leq 1$, $0 < y \leq 1$ and $0 < x+y \leq 1$. For instance, the ultra-thin barrier layer 110 can include aluminum indium nitride (e.g., AlInN).

Next, a dielectric thin film layer 112 can be formed over a portion of the ultra-thin barrier layer 110 to leave exposed areas 111 of the ultra-thin barrier layer 110 (i.e., that are substantially free from and uncovered by the dielectric thin film layer 112), as shown in FIG. 1. In one particular embodiment, the dielectric thin film layer 112 has a thickness of about 1 nm to about 100 nm. For example, the dielectric thin film layer can be deposited via a digital dielectric deposition method, such as described in U.S. patent application Ser. No. 11/800,712 of Khan, et al. filed on May 7, 2007, and U.S. Publication No. 2010/0187545 of Khan, et al. filed on Apr. 7, 2010, both of which are incorporated by reference herein.

In one embodiment, the dielectric thin film layer 112 can be formed over the portion of the ultra-thin barrier layer 110 to leave exposed areas 111 of the ultra-thin barrier layer 110 via (1) masking the ultra-thin barrier layer 110 with a photoresist layer in areas that correspond to the resulting exposed areas 111 while leaving the portion unmasked, and (2) pulsing a silicon source and an oxygen source to deposit the dielectric thin film layer 112 on the portion of the ultra-thin barrier layer 110.

Figure 2:
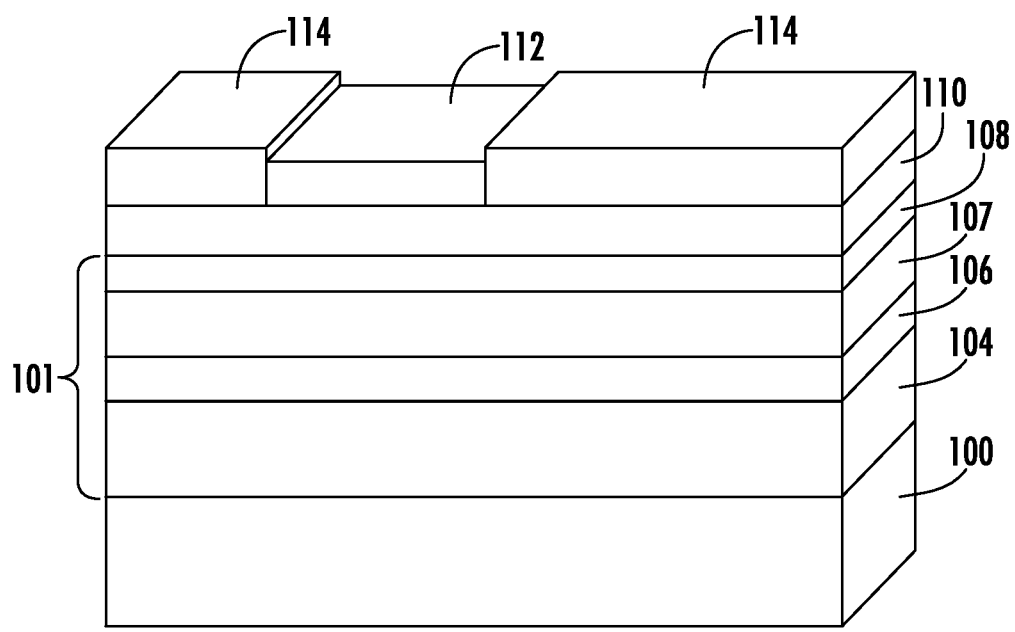

A selective area growth source drain (SAG S-D) thin film layer 114 can then be formed over the exposed areas 111 of the ultra-thin barrier layer 110 while leaving the dielectric thin film layer 112 exposed (i.e., that are substantially free from and uncovered by the SAG S-D thin film layer 114), as shown in FIG. 2. In one embodiment, the SAG S-D thin film layer 114 has a thickness of about 3 nm to about 15 nm. In one embodiment, the SAG S-D thin film layer 114 can include $Al_xIn_yGa_{1-x-y}N$ where $0 \leq x \leq 1$, $0 \leq y \leq 1$ and $0 < x+y \leq 1$. For instance, the SAG S-D thin film layer 114 can, in one particular embodiment, include AlInN. The dielectric thin film layer 112 can then be removed to expose the underlying ultra-thin barrier layer 110, as shown in FIG. 3.

Figure 3:
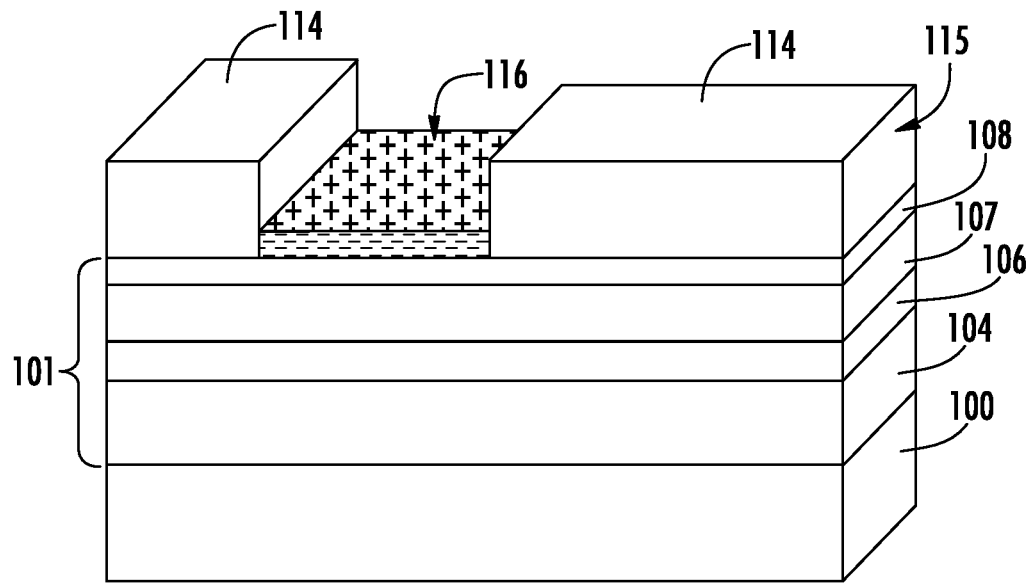

The exposed ultra-thin barrier layer 110 can then be treated with fluorine to form a treated area 116, as shown in FIG. 3, that corresponds to the underlying ultra-thin barrier layer 110 exposed by removal of the dielectric thin film layer 112. For example, the exposed ultra-thin barrier layer 110 can be treated with fluorine via fluorine passivation and etching with sulphur hexafluoride gas and carbon tertafluoride gas. In one embodiment, the sulphur hexafluoride gas and carbon tertafluoride gas can be pulsed during etching.

After treating with fluorine, the structure can be, in one embodiment then subjected to a soft anneal process. As used herein, the "soft anneal process" refers to an annealing process involving a relatively low temperature applied to the substrate for a relatively extended period. For example, the soft annealing process can involve, in one embodiment, exposing the substrate to a temperature of from about 60° C. to about 420° C. for a period ranging from about 30 seconds to about 120 minutes. This soft anneal can make the dielectric-semiconductor interface more smooth and also helps in proper adhesion of the dielectric layer. The side-walls of the etched portions may have some residues of unwanted/unreacted gas particles that are left behind. This soft anneal will desorbs the particles, thus improving the leakage performance.

In one embodiment, the soft anneal can be merge the ultra-thin barrier layer 110 and the SAG S-D thin film layer 114 to form a merged area 115, such as shown in FIGS. 3-6.

Figure 4:
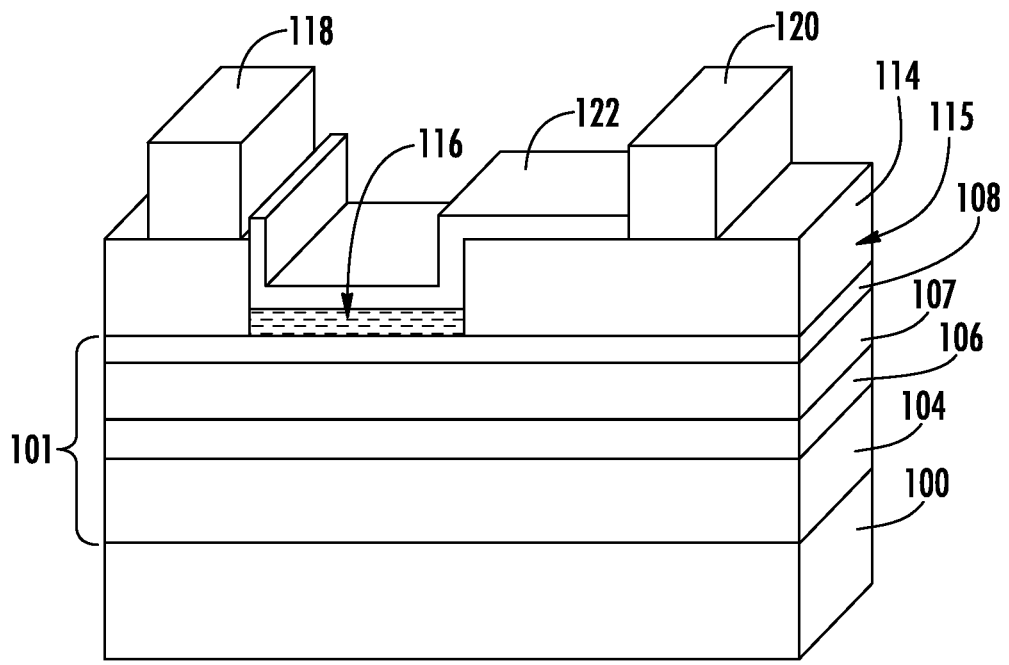

As shown in FIG. 4, a source 118 and drain 120 can then be added on the SAG S-D thin film layer 114, and a dielectric coating 122 can be deposited over the treated area 116 such that the dielectric coating 122 is positioned between the source 118 and the drain 120. The dielectric coating layer 122 is single or multistack layer of silicon dioxide, silicon nitride, silicon oxynitride, aluminum oxide, zirconium oxide etc.

Figure 5:
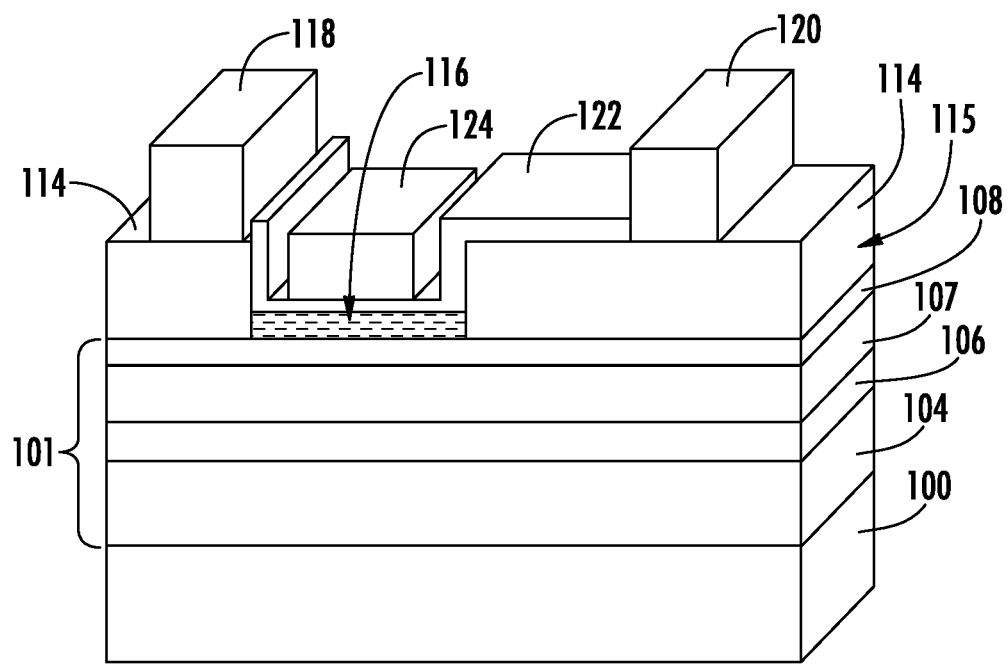

Finally, a gate electrode 124 can be positioned on the dielectric coating 122, as shown in FIG. 5. After completion of the gate electrode 124, the gate metal and contacts can be positioned on the HEMT structure according to known processes.

Figure 6:
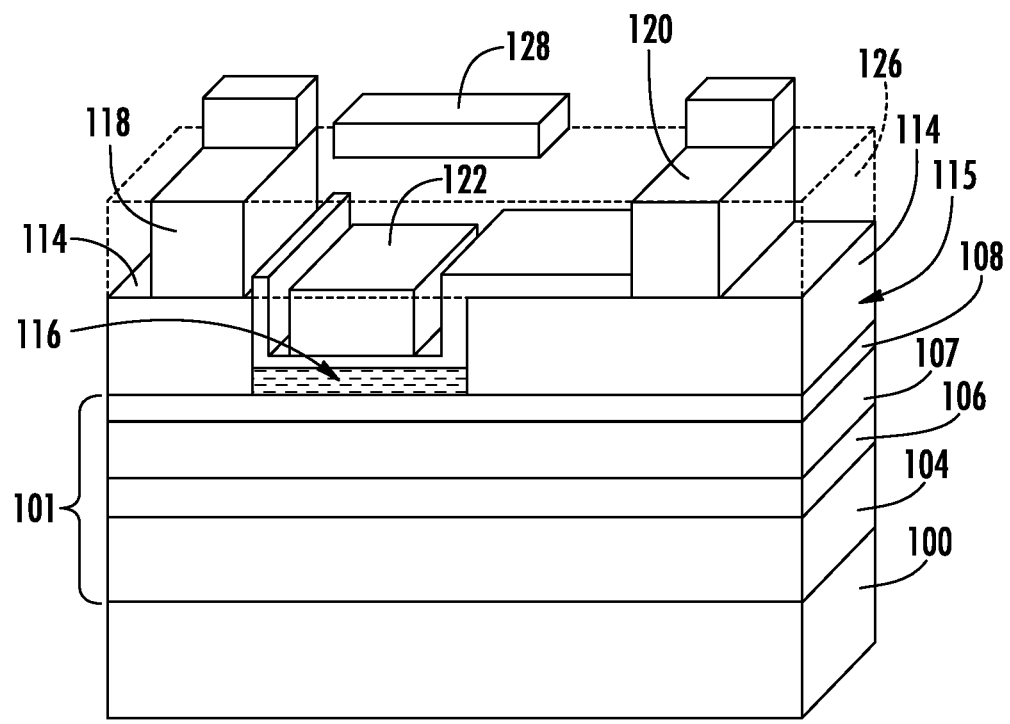

In one particular embodiment, a silicon based passivation layer 126 can be grown around the gate electrode 124, as shown in FIG. 6. For example, the silicon based passivation layer 126 can be deposited via a digital dielectric deposition method. Additionally, a field plate electrode 128 can be positioned on the silicon based passivation layer 126.

The device can, in one embodiment, be encapsulated by passivating dielectric film comprising a BCB or SOG polymer.

According to this method, the resulting HEMT device 10 can be formed, in a particular embodiment, without a recess etching step.

Figure 7:
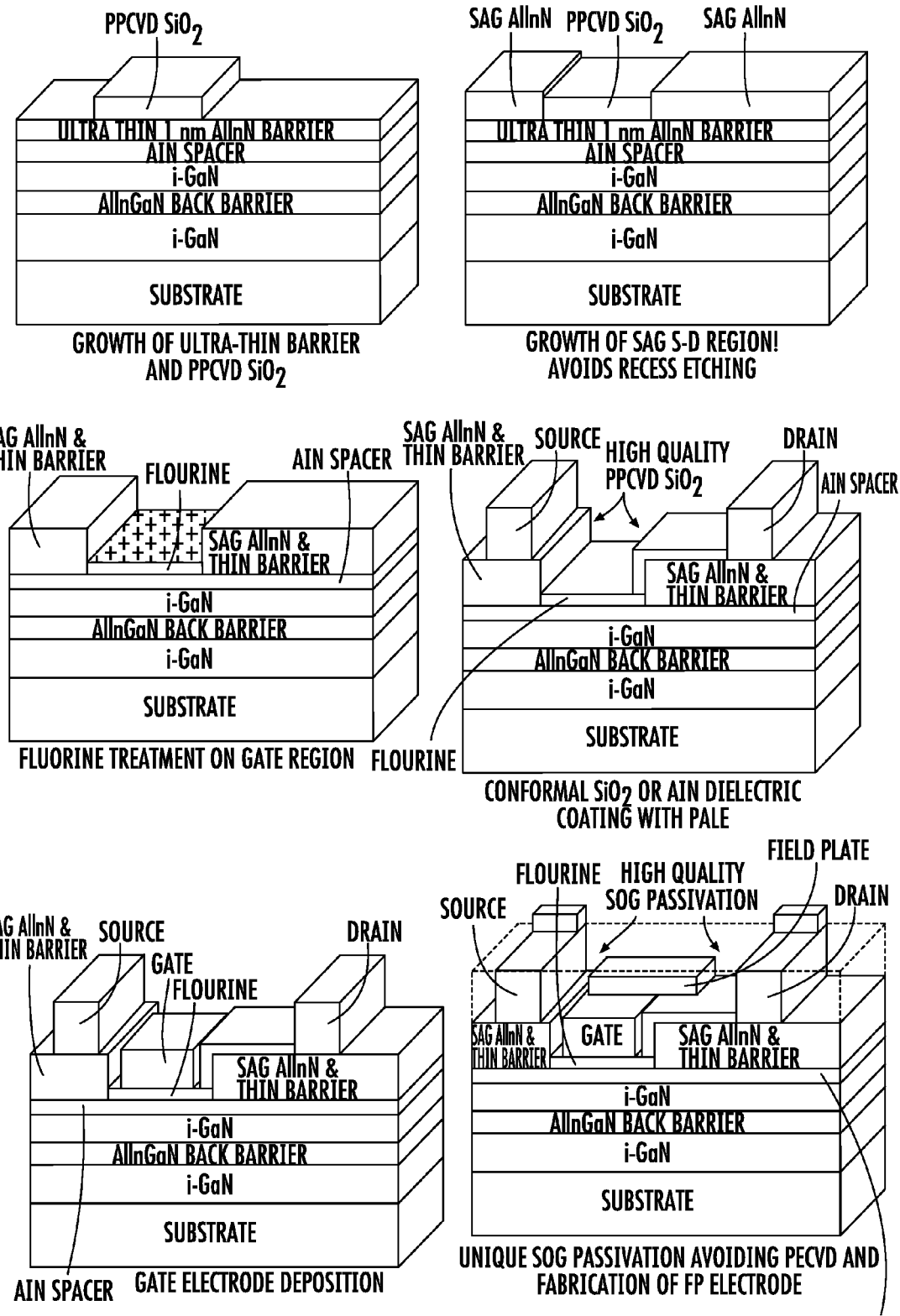
FIG. 7 sequentially shows a method of forming an exemplary SAG and the Device Processing Scheme for an exemplary AlInN—GaN Enhancement Mode (E-mode) HFET, according to one particular embodiment.

The resulting HEMT devices 10 are also provided, formed according to any embodiment of the presently disclosed methods as shown in FIG. 7

According to the presently disclosed methods, the distance between the gate dielectric and the intermediate middle layer can be reduced, leading to a reduced channel thickness. Thus, the gate width to channel thickness ratio can be increased (i.e., the gate width is relatively larger than the channel thickness). This increased ratio ensures that the carriers are not forced to spill over to either the surface or buffer, because of reduced potential across the 2DEG. This ensures higher output current, which will then yield higher output power at higher operating frequency which desired for many applications such as radar communication.

In one embodiment, the present invention is directed to a particular type of HEMT device that has a short period super-lattice structure. This particular device can have improved performance due to reduced trap and defect densities. In general, this particular structure has a group III nitride short period super-lattice with a spacer and channel layer to give rise to sharp and abrupt heterointerface, which is ideal quantum confinement with no spill over of electrons.

In addition to the selective area deposited device design and the pulsed materials deposition approach disclosed herein, the utilization is also provided for a low-power Plasma enhanced chemical vapor deposition process for the deposition of the conformal gate insulators to avoid side-wall leakage in E-mode devices. To reduce the $R_{on}$ values, the use of a selective area doping (SAD) scheme can lead to achieving a factor of 2 or better improvement for AlGaN—GaN HFETs. Furthermore, the use of high power PECVD deposited insulting SiN layers is avoided for the reduction of the current collapse by using a doped AlN/GaN cap layer. A new polymer based surface passivation is also generally provided for optoelectronic devices.

Thus, according to embodiments of the presently disclosed methods, one or more of these advantages can be realized:

1. Selective area re-growth of the source-drain and channel region to create the gate recess.
2. Growth of low-defect buffer and channel layers (GaN) using pulsed lateral overgrowth process and pulsed atomic layer epitaxy.
3. Selective area doping procedure to reduce the access resistances.
4. Digital pulsed deposition of insulator layers to avoid gate leakage and premature surface breakdown.
5. A new polymer based surface passivation to avoid plasma related surface damage.
6. Exploration of a new insitu CVD deposited pulsed AlN layer for surface passivation.
7. Extremely low power plasma enhanced CVD of fluorine to modulate the threshold voltage.
8. Exploration of field-plated enhancement mode structures.
9. Exploration of low power PECVD deposited SiO2/SiN for the insulating gate E-mode devices.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method of forming a HEMT device on a plurality of thin film layers on a substrate, the method comprising:
    forming an ultra-thin barrier layer on the plurality of thin film layers, wherein the ultra-thin barrier layer has a barrier thickness of about 0.2 nm to about 20 nm;
    forming a dielectric thin film layer over a portion of the ultra-thin barrier layer to leave exposed areas of the ultra-thin barrier layer, wherein the dielectric thin film layer has a thickness of about 1 nm to about 100 nm;
    forming an SAG S-D thin film layer over the exposed areas of the ultra-thin barrier layer while leaving the dielectric thin film layer exposed, wherein the SAG S-D thin film layer has a thickness of about 3 nm to about 15 nm;
    removing the dielectric thin film layer to expose the underlying ultra-thin barrier layer;
    treating with fluorine the underlying ultra-thin barrier layer exposed by removal of the dielectric thin film layer to form a treated area;
    adding a source and drain on the SAG S-D thin film layer;
    depositing a dielectric coating over the ultra-thin barrier layer treated with fluorine such that the dielectric coating is positioned between the source and the drain; and
    positioning a gate electrode on the dielectric coating.
2. The method as in claim 1, wherein the plurality of thin film layers on the substrate comprises:
    a group III nitride epilayer on the substrate;
    a back barrier layer on the group III nitride epilayer;

a spacer layer on the back barrier layer and
a thin barrier layer on the spacer layer.

3. The method as in claim 2, wherein the group III nitride epilayer comprises $Al_xIn_yGa_{1-x-y}N$, where $0 \leq x \leq 1$, $0 \leq y \leq 1$ and $0 < x+y \leq 1$.

4. The method as in claim 3, wherein the group III nitride epilayer comprises a short period super lattice, wherein the short period super lattice is grown via pulsed atomic layer epitaxy to form adjacent layers having a chemical structure of $Al_xIn_yGa_{1-x-y}N$ and $Al_rIn_sGa_{(1-r-s)}N$, respectfully, wherein $0 \leq x \leq 1$, $0 \leq y \leq 1$, $0 < x+y \leq 1$, $0 \leq r \leq 1$, $0 \leq s \leq 1$, $0 < r+s \leq 1$, and wherein x and r are different and y and s are different.

5. The method as in claim 2, wherein the group III nitride epilayer comprises gallium nitride.

6. The method as in claim 2, wherein the back barrier layer comprises AlInGaN.

7. The method as in claim 2, wherein the spacer layer is deposited by pulsed atomic layer epitaxy.

8. The method as in claim 2, wherein the spacer layer comprises $Al_xIn_yGa_{1-x-y}N$, wherein $0 \leq x \leq 1$, $0 \leq y \leq 1$ and $0 < x+y \leq 1$.

9. The method as in claim 2, wherein the spacer layer comprises aluminum nitride.

10. The method as in claim 1, wherein the dielectric thin film layer is deposited via a digital dielectric deposition method.

11. The method as in claim 1, wherein forming a dielectric thin film layer over the portion of the ultra-thin barrier layer to leave exposed areas of the ultra-thin barrier layer comprises:
   masking the ultra-thin barrier layer with a photoresist layer in areas that correspond to the resulting exposed areas while leaving the portion unmasked; and
   pulsing a silicon source and an oxygen source to deposit the dielectric thin film layer on the portion of the ultra-thin barrier layer.

12. The method as in claim 1, wherein treating the ultra-thin barrier layer with fluorine comprises a fluorine passivating etching with sulphur hexafluoride gas and carbon tertafluoride gas.

13. The method as in claim 12, wherein sulphur hexafluoride gas and carbon tertafluoride gas are pulsed.

14. The method as in claim 1, further comprising:
   growing a silicon based passivation layer around the gate electrode, wherein the silicon based passivation layer is deposited via a digital dielectric deposition method.

15. The method as in claim 14, further comprising:
   positioning a field plate electrode on the silicon based passivation layer.

16. The method as in claim 1, wherein the device is encapsulated by passivating dielectric film comprising a BCB or SOG polymer.

17. The method as in claim 1, wherein the HEMT device is formed without a recess etching step.

18. The method as in claim 1, wherein the SAG S-D thin film layer comprises AlInN.

19. A HEMT device formed according to the method of claim 1.

20. The method as in claim 2, wherein the plurality of thin film layers on the substrate further comprises: a buffer layer between the group III nitride epilayer and the substrate.

21. The method as in claim 2, wherein the plurality of thin film layers on the substrate further comprises: a second group III nitride epilayer between the back barrier layer and the spacer layer.

* * * * *

UNITED STATES PATENT AND TRADEMARK OFFICE
CERTIFICATE OF CORRECTION

| | | |
|---|---|---|
| PATENT NO. | : 8,796,097 B2 | Page 1 of 1 |
| APPLICATION NO. | : 13/870558 | |
| DATED | : August 5, 2014 | |
| INVENTOR(S) | : Khan et al. | |

It is certified that error appears in the above-identified patent and that said Letters Patent is hereby corrected as shown below:

On the Title Page, Abstract (57), "...ultra-thin barrier layer is treating..." should read --ultra-thin barrier layer is treated--;

In the Claims
Column 8, Line 7, "...tertafluoride gas..." should read --tetrafluoride gas--;
Column 8, Line 9, "...tertafluoride gas..." should read --tetrafluoride gas--.

Signed and Sealed this
Seventh Day of April, 2015

Michelle K. Lee
*Director of the United States Patent and Trademark Office*